United States Patent
Sato

(10) Patent No.: US 9,356,077 B2
(45) Date of Patent: May 31, 2016

(54) LIGHT-EMITTING ELEMENT DISPLAY DEVICE

(71) Applicant: Japan Display Inc., Tokyo (JP)

(72) Inventor: Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/678,059

(22) Filed: Apr. 3, 2015

(65) Prior Publication Data

US 2015/0287768 A1 Oct. 8, 2015

(30) Foreign Application Priority Data

Apr. 7, 2014 (JP) ................................. 2014-078973

(51) Int. Cl.
*H01L 27/32* (2006.01)
*H01L 51/52* (2006.01)

(52) U.S. Cl.
CPC ......... *H01L 27/3232* (2013.01); *H01L 51/5253* (2013.01)

(58) Field of Classification Search
CPC ............ H01L 27/1225; H01L 29/7869; H01L 29/66969; H01L 29/78606; H01L 27/124; H01L 27/1255; H01L 29/786; H01L 29/78696; H01L 27/1218; H01L 27/3232; H01L 51/5253; G02F 1/1368; G02F 1/136227; G02F 1/134309

See application file for complete search history.

(56) References Cited

U.S. PATENT DOCUMENTS

| | | | |
|---|---|---|---|
| 2005/0082969 A1* | 4/2005 | Tokuda | H01L 27/3276 313/506 |
| 2011/0227048 A1 | 9/2011 | Newsome | |
| 2014/0002777 A1* | 1/2014 | Kim | G02F 1/133362 349/106 |
| 2015/0206929 A1* | 7/2015 | Sato | H01L 27/32 257/40 |
| 2015/0262530 A1* | 9/2015 | Sato | G09G 3/3233 345/83 |
| 2015/0286103 A1* | 10/2015 | Sato | G02F 1/134309 349/86 |

FOREIGN PATENT DOCUMENTS

| | | |
|---|---|---|
| JP | 2006-276089 A | 10/2006 |
| JP | 2012-509551 A | 4/2012 |

* cited by examiner

*Primary Examiner* — Jany Richardson
(74) *Attorney, Agent, or Firm* — Typha IP LLC

(57) ABSTRACT

A light-emitting element display device includes a substrate including a display area having plural pixels arranged in matrix form, a lower electrode provided in each of the plural pixels on the substrate and made of a conductor, an organic layer provided on the lower electrode and including a light-emitting layer, an upper electrode provided on the organic layer and made of a conductor, a polymer dispersed liquid crystal layer disposed at an opposite side to a substrate side of the upper electrode and covering the display area, and an electrode layer provided at the opposite side to the substrate side of the upper electrode and made of a conductor. The electrode layer is disposed to extend over the plural pixels.

16 Claims, 13 Drawing Sheets

LIGHT-EMITTING ELEMENT DISPLAY DEVICE

CROSS-REFERENCE TO RELATED APPLICATION

The present application claims priority from Japanese application JP2014-078973 filed on Apr. 7, 2014, the content of which is hereby incorporated by reference into this application.

BACKGROUND OF THE INVENTION

1. Field of the Invention

The present invention relates to a light-emitting element display device.

2. Description of the Related Art

In recent years, a light-emitting element display device using a self-luminous body, such as an organic light-emitting diode (OLED), is put into practical use. As compared with a related art liquid crystal display device, the light-emitting element display device including an organic EL (Electroluminescent) display device using the OLED is superior in visibility and response speed, since the self-luminous body is used. Moreover, since an auxiliary illuminating device such as a backlight is not used, further thinning is possible.

JP 2006-276089A discloses an organic EL display device including a PDLC (Polymer Dispersed Liquid Crystal) layer, which is controlled such that the PDLC layer has transparency in a state where a light-emitting element emits light, and the PDLC layer has light-absorbing properties in a state where the light-emitting element does not emit light.

JP 2012-509551A discloses a light-emitting organic electroluminescent element in which a PDLC layer is provided, and inner reflection and cavity effect are reduced by scattering by the PDLC.

The organic EL display device normally includes a reflection film for enhancing light-emitting efficiency at a back side of a light-emitting layer when viewed from an observer. However, when external light is high in, for example, an outdoor place, visibility of an image may be deteriorated by reflection of the external light by the reflection film or rainbow patterns may appear on a screen. Hitherto, in order to prevent the external light reflection, a structure is proposed in which a circular polarizing plate is placed on the upper surface of a display panel. However, the light transmittance of the circular polarizing plate is as low as less than 50%, and the light-emitting efficiency is reduced. Besides, since the addition of the circular polarizing plate adds a new manufacturing process, there is a fear that the manufacturing cost increases.

SUMMARY OF THE INVENTION

The invention is made in view of the foregoing circumstances and has an object to provide a light-emitting element display device which can display with high visibility even when external light environment is changed.

The light-emitting element display device of the invention includes a substrate including a display area having plural pixels arranged in matrix form, a lower electrode provided in each of the plural pixels on the substrate and made of a conductor, an organic layer provided on the lower electrode and including a light-emitting layer, an upper electrode provided on the organic layer and made of a conductor, a polymer dispersed liquid crystal layer disposed at an opposite side to a substrate side of the upper electrode and covering the display area, and an electrode layer provided at the opposite side to the substrate side of the upper electrode and made of a conductor, and the electrode layer is disposed to extend over the plural pixels.

Here, the "pixel" means a unit having a light-emitting element, and when the pixel is constituted of plural light-emitting elements and includes plural sub-pixels, the "pixel" means the sub-pixel.

Besides, in the light-emitting element display device of the invention, the electrode layer may be a solid electrode covering all the display area. Besides, in the light-emitting element display device of the invention, the electrode layer may have a mesh shape or a strip shape and may cover the display area.

Besides, in the light-emitting element display device of the invention, the polymer dispersed liquid crystal layer may be provided between the electrode layer and the upper electrode. In this case, an upper electrode sealing film covering the display area may be further provided between the upper electrode and the polymer dispersed liquid crystal layer.

Besides, in the light-emitting element display device of the invention, a polymer dispersed liquid crystal layer sealing film covering the display area may be further provided between the polymer dispersed liquid crystal layer and the electrode layer.

Besides, in the light-emitting element display device of the invention, an electrode layer sealing film covering the display area may be further provided on the electrode layer.

A light-emitting element display device of the invention includes a substrate including a display area having plural pixels arranged in matrix form, a lower electrode provided in each of the plural pixels on the substrate and made of a conductor, a pixel separation film covering an end part of the lower electrode and defining a light-emitting area, an organic layer provided on the lower electrode and including a light-emitting layer, an upper electrode provided on the organic layer and made of a conductor, a sealing film provided on the upper electrode and covering the display area, an electrode layer provided on the sealing film in an area overlapping the pixel separation film in plan view and made of a conductor, and a polymer dispersed liquid crystal layer provided on the sealing film and the electrode layer and covering the display area.

Besides, in the light-emitting element display device of the invention, the electrode layer may include plural electrodes electrically independent of each other in the display area, and in this case, the plural electrodes may extend in a strip shape in one direction in the display area. Further, in this case, the plural electrodes extending in a strip shape may be provided between lines of the adjacent pixels extending in the one direction.

Besides, in the light-emitting element display device of the invention, the electrode layer arranged on the display area may be integrally provided and may have a same potential.

Besides, in the light-emitting element display device of the invention, the organic layer may have a micro-cavity structure in which light is resonated and enhanced.

Besides, in the light-emitting element display device of the invention, an external light sensor to measure a peripheral brightness and a potential control part to control a potential of the electrode layer based on an output of the external light sensor may be further provided.

DETAILED DESCRIPTION OF THE INVENTION

Figure 1:
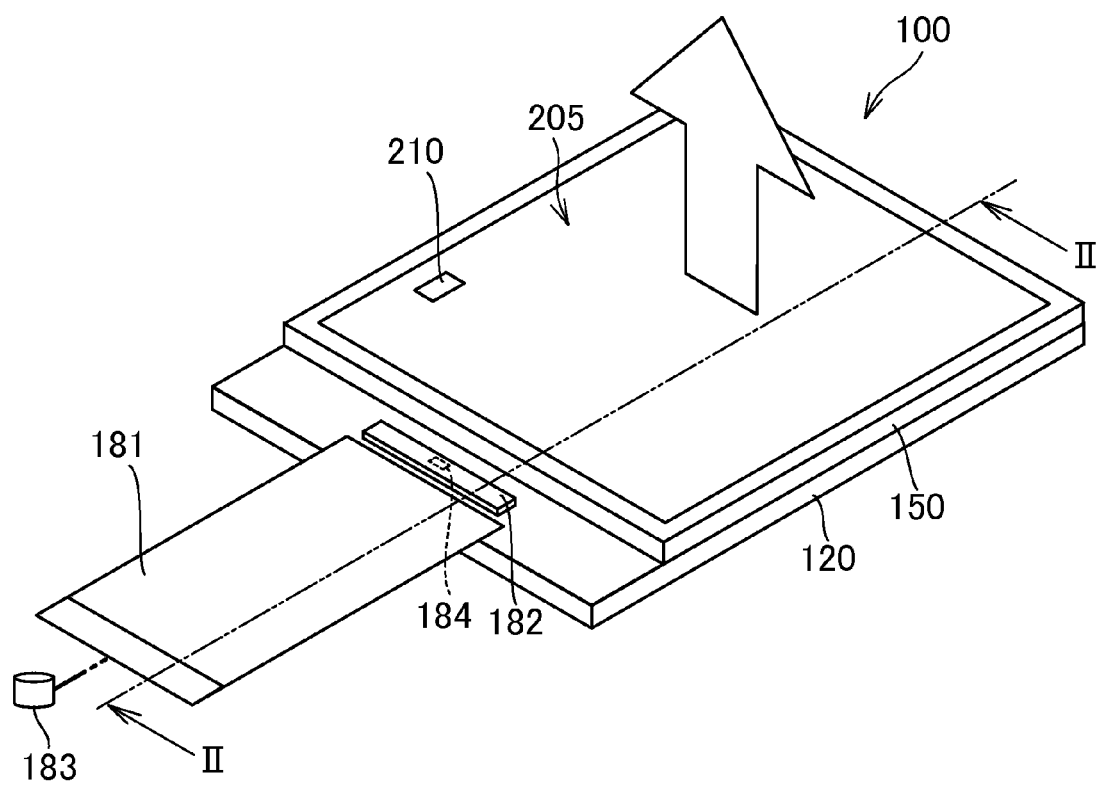
FIG. 1 is a view schematically showing an organic EL display device as a light-emitting element display device of a first embodiment of the invention.

Hereinafter, embodiments of the invention will be described with reference to the drawings. Incidentally, the disclosure is merely an example, and suitable modifications made while the gist of the invention is maintained and easily conceivable by a skilled person in the art is also included in the scope of the invention. Besides, in order to clarify the description, the drawings are schematically shown in widths, thicknesses, shapes and the like of respective parts as compared with actual forms. These are merely examples and do not limit the interpretation of the invention. Besides, in the specification and the respective drawings, the same components as those in already-described drawings are denoted by the same reference numerals and the detailed description thereof is suitably omitted.

First Embodiment

FIG. 1 schematically shows an organic EL display device 100 as a light-emitting element display device of a first embodiment of the invention. As shown in this drawing, the organic EL display device 100 includes two substrates of a TFT (Thin Film Transistor) substrate 120 and an opposite substrate 150. A display area 150 made of pixels 210 arranged in matrix form are formed in the TFT substrate 120 and the opposite substrate 150 of the organic EL display device 100. Here, each of the pixels 210 is constituted of plural sub-pixels 212 (described later).

The TFT substrate 120 is a substrate made of transparent glass or resin insulation material. A drive IC (Integrated Circuit) 182, which is a drive circuit to apply a potential for conducting between a source and a drain to a scanning signal line of a pixel transistor arranged in each of the sub-pixels 212 and to apply a voltage corresponding to a gradation value of the sub-pixel 212 to an image signal line, is mounted on the TFT substrate 120. Further, an FPC (Flexible Printer Circuits) 181 for inputting an image signal and the like from the outside is attached to the TFT substrate. Besides, an illuminance sensor (brightness sensor) 183 as an external light sensor for measuring external light illuminance in the environment of the organic EL display device 100 may be provided. In this case, the output of the illuminance sensor 183 is directly or indirectly notified to the drive IC 182. Further, the drive IC 182 includes a potential control part 184 to control display quality based on the output of the illuminance sensor 183 or a user's instruction. Here, a camera or an environmental light sensor built in a terminal device provided with the light-emitting element display device can be used as the external light sensor such as the illuminance sensor. Incidentally, in the embodiment, as indicated by an arrow of the drawing, the top emission type organic EL display device is adopted in which light is emitted to a side of the TFT substrate 120 where a light-emitting layer is formed.

Figure 2:
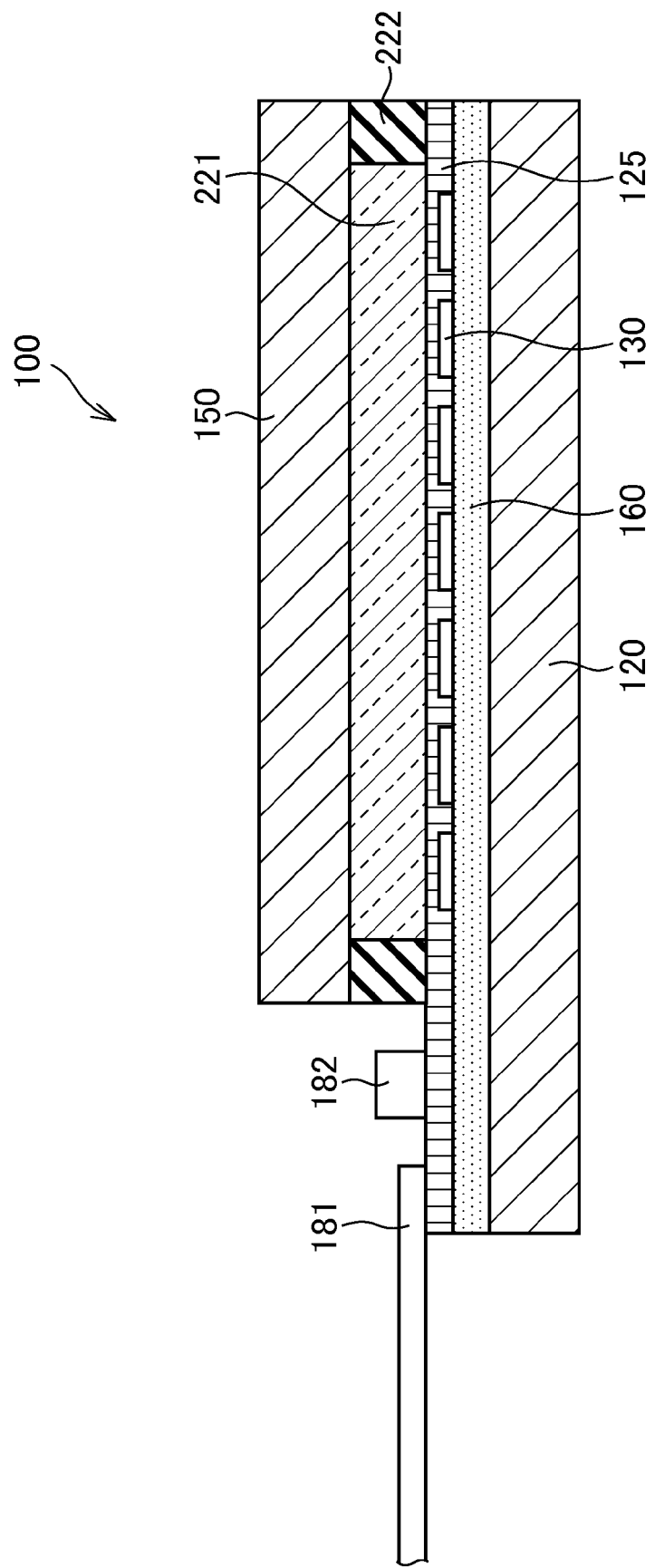
FIG. 2 is a view schematically showing a section along line II-II of FIG. 1.

FIG. 2 is a view schematically showing a section along line II-II of FIG. 1. As shown in this sectional view, the TFT substrate 120 includes a TFT circuit layer 160 in which a TFT circuit is formed, plural organic EL elements 130 as plural light-emitting elements formed on the TFT circuit layer 160, and a sealing film 125 covering the organic EL elements 130 and for shielding moisture. Although the organic EL element 130 is formed for each of the sub-pixels 212 included in the pixel 210, the drawing of FIG. 2 is simplified for facilitating the description. The opposite substrate 150 is provided with color filters to allow light of different wavelengths of, for example, three or four colors to pass through, a black matrix as a light shielding film to shield light emitted from boundaries of the respective sub-pixels 212, and an after-mentioned electrode layer. A polymer dispersed liquid crystal layer 221 between the TFT substrate 120 and the opposite substrate 150 is sealed by a sealing agent 222.

Incidentally, in the embodiment, although the drive IC 182 is arranged on the TFT substrate 120, the drive IC 182 may be arranged on the FPC 181, and the drive circuit may be directly formed on the TFT substrate 120. Besides, the TFT substrate 120 may be made of soft resin material, and the opposite substrate 150 may not be provided. In this case, the TFT substrate 120 may be integrated with the FPC 181. Besides, in this embodiment, the organic EL element 130 emits white light, and the color filters are used to allow light in wavelength ranges of three or four colors to pass through. However, the organic EL elements 130 may emit light in different wavelength ranges of, for example, three or four colors.

Figure 3:
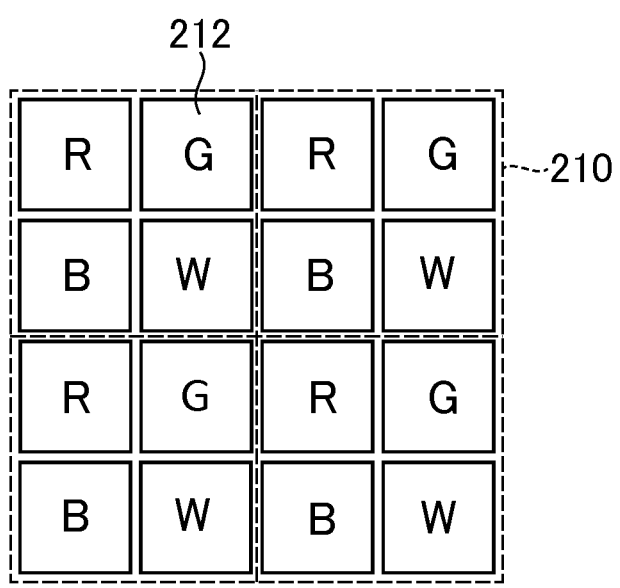
FIG. 3 is a view showing a structural example of sub-pixels included in a pixel of FIG. 1.
Figure 4:
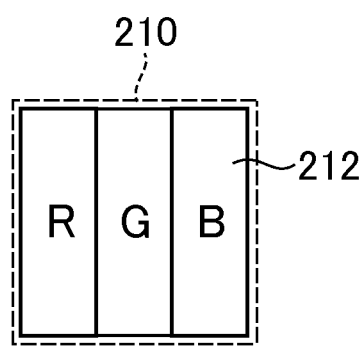
FIG. 4 is a view showing a structural example of sub-pixels included in the pixel of FIG. 1.

FIG. 3 is a view showing a structural example of the sub-pixels 212 included in the pixel 210 of FIG. 1. As shown in this drawing, the pixel 210 includes the substantially square sub-pixels 212 to emit light in wavelength ranges corresponding to four kinds of colors of R (Red), G (Green), B (Blue) and W (White). The sub-pixels 212 are arranged in a shape of a cross inside a square, so that two sides of one sub-pixel contact two sides of another sub-pixel 212 in the same pixel 210. Incidentally, the structure of the sub-pixels 212 in the pixel 210 is not limited to the structure of FIG. 3, and may be a stripe structure including the sub-pixels 212 corresponding to three colors of RGB shown in FIG. 4, or may be a stripe structure using four kinds of colors. The arrangement of the sub-pixels 212 constituting the pixel 210 is not limited to theses, and can be suitably determined.

Figure 5:
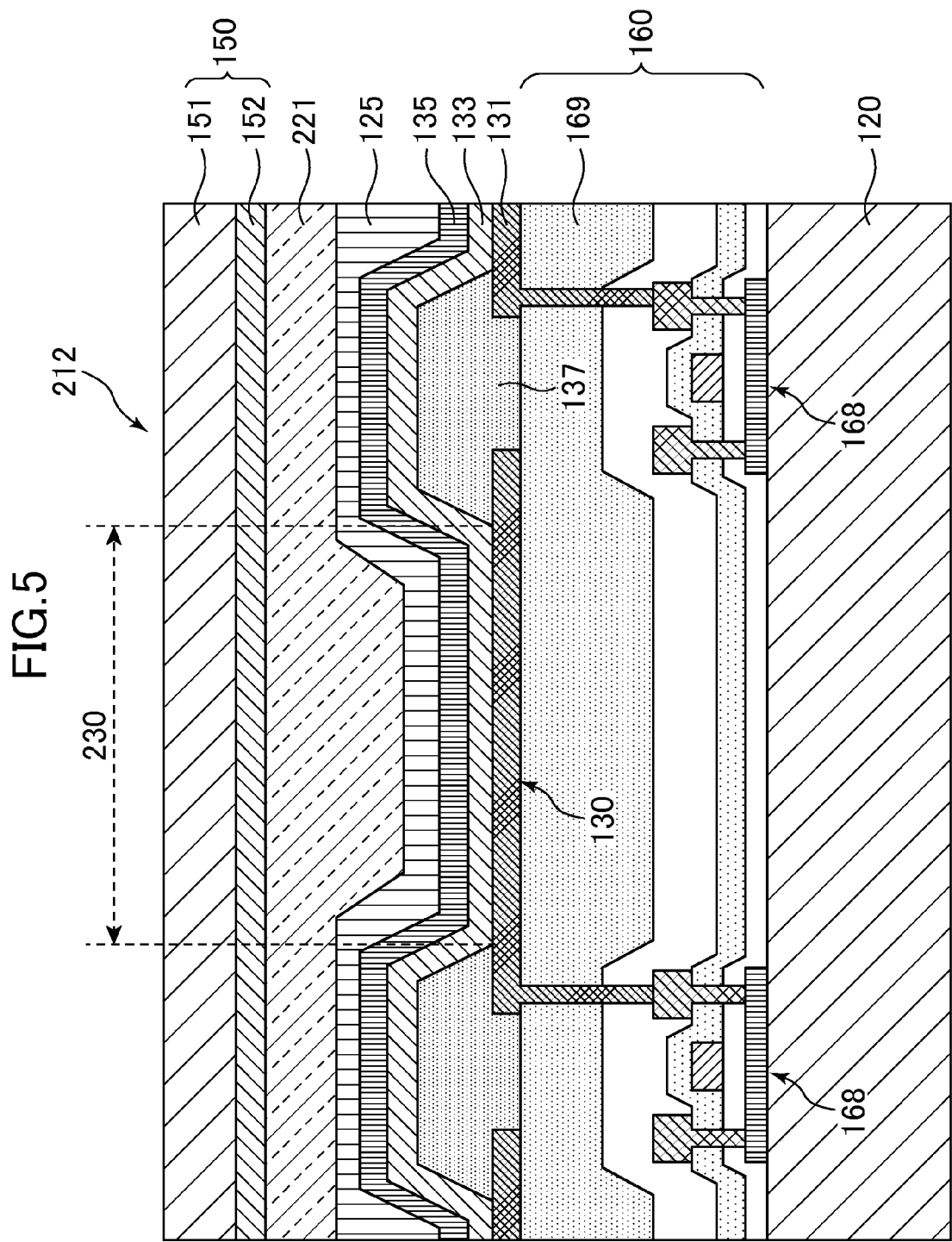
FIG. 5 is an enlarged view of an example of a section of a sub-pixel.

FIG. 5 is an enlarged view of an example of a section of the sub-pixel 212. As shown in this drawing, one of a source and a drain of a drive transistor 168 in the TFT circuit layer 160 is made of, for example, ITO (Indium Tin Oxide) or Ag, and is connected to a lower electrode 131 independent in each of the sub-pixels 212. An end part of the lower electrode 131 is covered with a pixel separation film 137 made of insulation material in order to keep insulation from the lower electrode 131 of the adjacent sub-pixel 212. An organic layer 133 including a light-emitting layer is formed on the pixel separation film 137 and the lower electrode 131 so as to cover the display area 205. Further, an upper electrode 135 paired with the lower electrode 131 and for causing the light-emitting layer to emit light is formed of a transparent electrode of ITO or the like. In order to prevent deterioration of the organic layer 133, the sealing film 125 for preventing air intrusion is formed on the upper electrode 135 so as to cover the display area 205.

The polymer dispersed liquid crystal layer 221 made of polymer dispersed liquid crystal is arranged on the sealing film 125, and is overlapped with the opposite substrate 150. The polymer dispersed liquid crystal has such properties that when an electric field is applied, a transmission state occurs in which visible light is transmitted, and when an electric field is not applied, a scattering state occurs in which incident light is scattered. In the opposite substrate 150, color filters and black matrix, and an electrode layer 152 as a solid electrode covering the display area 205 are formed on a substrate 151. The electrode layer 152 corporates with the upper electrode 135 to which a specified fixed potential is applied and forms an electric field to the polymer dispersed liquid crystal layer 221.

In each of the sub-pixels 212, the drive transistor 168 connected to the lower electrode 131 supplies a current reflecting a gradation voltage of each of the sub-pixels 212, and causes the light-emitting layer in the organic layer 133 between the upper electrode 135 kept at the common potential and the lower electrode 131 to emit light. The organic layer 133 has a film thickness adjusted so that the light emitted from the upper electrode 135 is enhanced by using a resonance effect and can be made to use the so-called micro-cavity effect. When the micro-cavity effect is used, the adjustment can be made so that especially the front brightness becomes high.

Here, the electrode layer 15 is the solid electrode. However, the electrode layer may be, for example, a meth-shaped electrode in which a hole is opened for each of the pixels 210 or each of the sub-pixels 212, or may be plural electrodes extending in a strip shape in a horizontal direction or a vertical direction of the display area 205. Besides, in this embodiment, the organic layer 133 is the layer covering the display area 205 and emits light of, for example, W (White) in each of the sub-pixels 212. However, the organic layer may be constructed so as to have the sub-pixels 212 in which the light-emitting layer is differently colored for each of the sub-pixels 212 and light in wavelength ranges of different colors is emitted in each of the pixels 210.

Incidentally, potential application to the electrode layer 152 is performed through the potential control part 184 of FIG. 1, and the uniform potential can be applied to the electrode layer 152 by contact with wirings at plural places and at the outside of the display area. Incidentally, although the potential control part 184 is provided in the drive IC 182, the potential control part may be provided in a control circuit other than the drive IC 182, and the control of potential of the electrode layer 152 may be performed through a terminal directly provided on the opposite substrate 150. Besides, an instruction to the potential control part 184 may be manually performed, that is, may be performed by using an input device such a touch panel from a screen providing a setting function of screen display, or switching may be performed by using the output of the illuminance sensor 183 of FIG. 1. In this case, the switching may be performed not only in two stages of the transmission state and the scattering state, but also in three or more stages or continuously stagelessly.

Besides, in the output of the illuminance sensor 183, the control can be performed such that when the external light is determined to be high, the polymer dispersed liquid crystal layer 221 is brought into the transmission state, and when the external light is determined to be low, the polymer dispersed liquid crystal layer 221 is brought into the scattering state. On the contrary, the control can also be performed such that when the external light is determined to be high, the scattering state is generated, and when the external light is determined to be low, the transmission state is generated. This is influenced by design factors, for example, the degree of reflection of external light by the lower electrode 131 serving also as a reflection film for external light reflection. That is, the transmission state and the diffusion state are suitably selected, so that, even when the external light environment is changed, display can be performed with high visibility.

Figure 6:
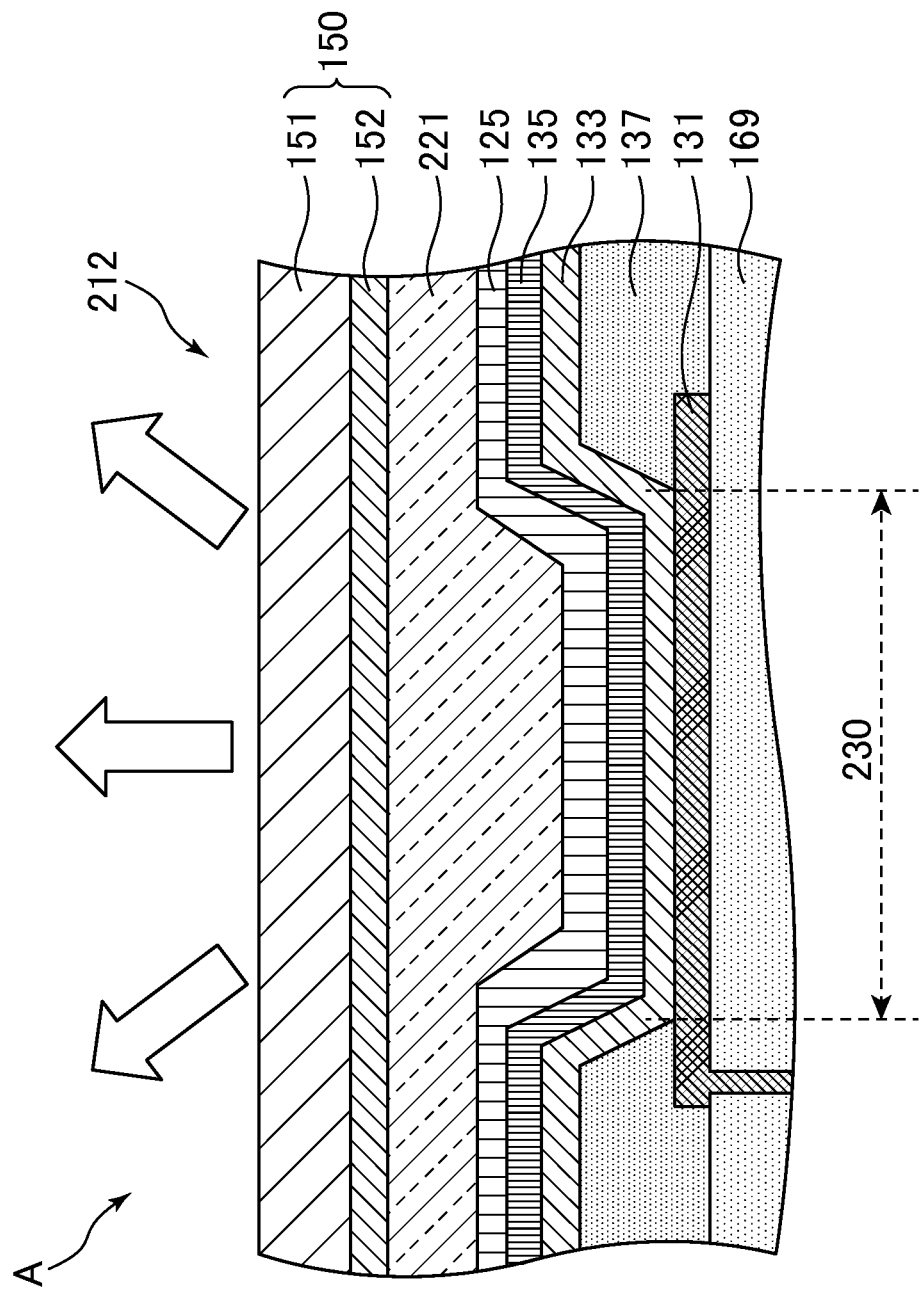
FIG. 6 is a view showing a case where the same potential as that of an upper electrode is applied to an electrode layer.
Figure 7:
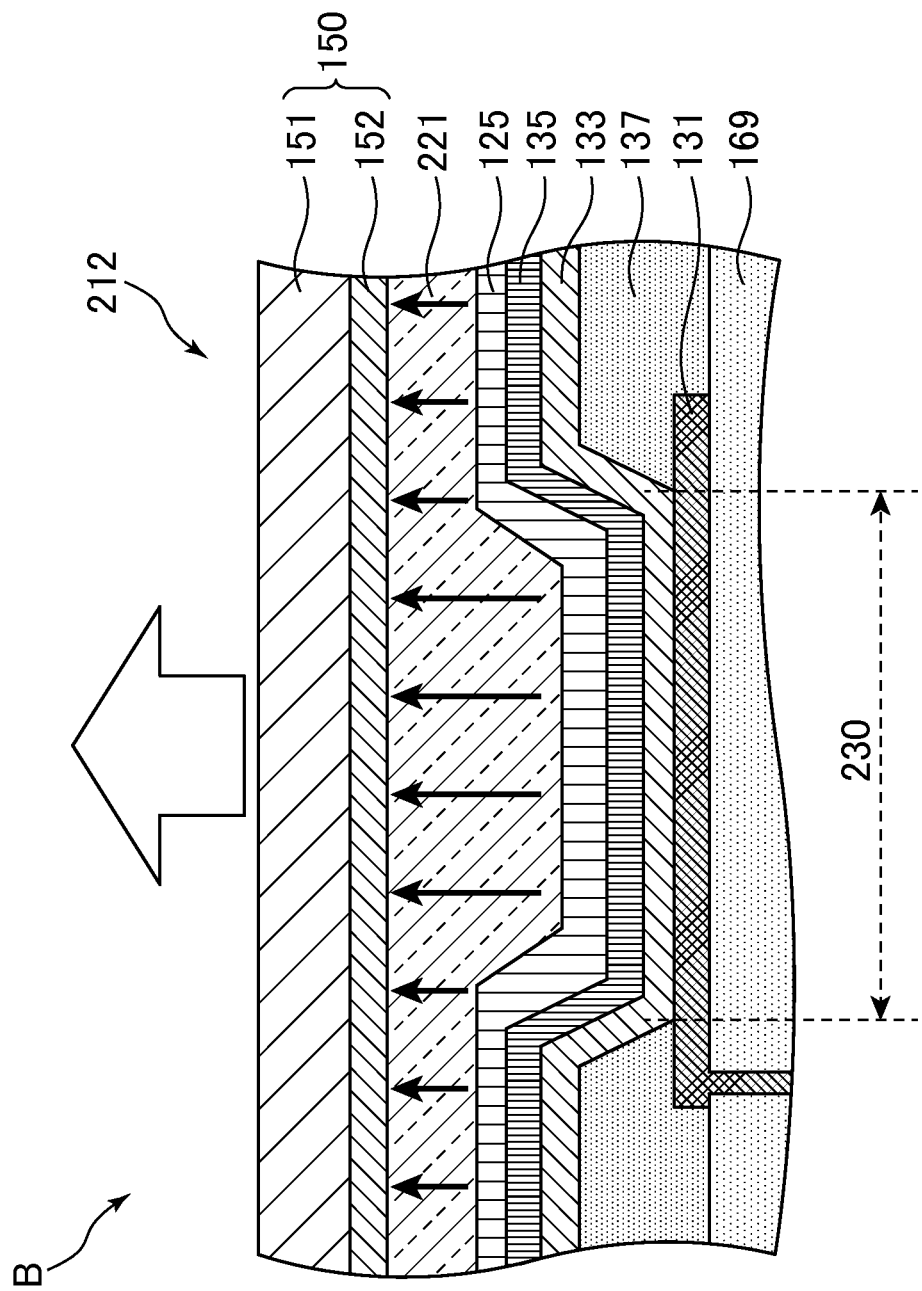
FIG. 7 is a view showing a case where a potential different from that of the upper electrode is applied to the electrode layer.

FIGS. 6 and 7 are views for explaining viewing angle control at display time in the structure of FIG. 5. FIG. 6 is a view showing a case where the same potential as that of the upper electrode 135 is applied to the electrode layer 152. In this case, since an electric field is not formed between the upper electrode 135 and the electrode layer 152, the polymer dispersed liquid crystal is brought into the scattering state. Thus, the light emitted from the light-emitting layer is scattered, and the light is emitted not only in a front direction but also in an oblique direction. As a result, image display with a wide viewing angle can be performed.

Figure 8:
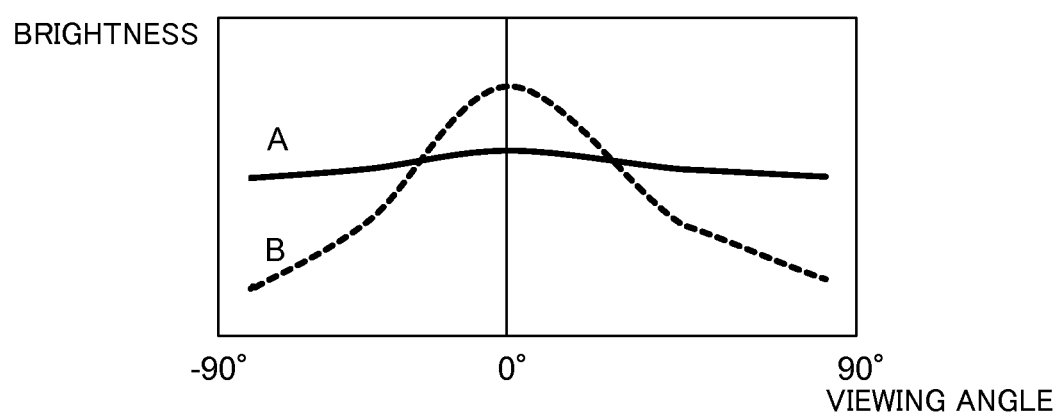
FIG. 8 is a graph showing a relation between viewing angle and brightness in viewing angle control.

FIG. 7 is a view showing a case where a potential different from that of the upper electrode 135 is applied to the electrode layer 152. In this case, as indicated by arrows in the polymer dispersed liquid crystal layer 221, an electric field is formed between the upper electrode 135 and the electrode layer 152, and the polymer dispersed liquid crystal is brought into the transmission state. Thus, the front brightness becomes higher than that in the scattering state. Especially, when the micro-cavity effect is used, the front brightness becomes further high. FIG. 8 is a graph showing a relation between viewing angle and brightness in a case (A) where the same potential as that of the upper electrode 135 is applied to the electrode layer 152 and in a case (B) where a potential different from that of the upper electrode 135 is applied to the electrode layer 152. As shown in this graph, in (A), since the polymer dispersed liquid crystal is in the scattering state, the brightness is high over a wide viewing angle. On the other hand, in (B), since the polymer dispersed liquid crystal is in the transparent state, although the brightness is high especially in the front direction, the viewing angle is narrow.

In FIG. 5, the sealing film 125 is formed between the polymer dispersed liquid crystal layer 221 and the upper electrode 135. However, since the polymer dispersed liquid crystal has hygroscopicity, the polymer dispersed liquid crystal layer can serve also as the sealing film 125. In this case, the sealing film 125 is omitted, and the polymer dispersed liquid crystal layer 221 can be directly arranged on the upper electrode 135. By this, the manufacturing process can be simplified. Further, moisture intrusion into the organic layer 133 can be more efficiently prevented by the hygroscopicity of the polymer dispersed liquid crystal, long term reliability can be obtained, and the life can be prolonged.

Besides, here, in FIG. 5, when the sealing film 125 formed on the upper electrode 135 is called the upper electrode sealing film 125, a polymer dispersed liquid crystal layer sealing film as a sealing film formed to cover the display area 205 may be provided together with the upper electrode sealing film 125 or singly between the polymer dispersed liquid crystal layer 221 and the electrode layer 152. Besides, on the electrode layer 152, an electrode layer sealing film as a sealing film formed to cover the display area 205 may be provided together with the upper electrode sealing film 125 or singly.

When the sealing film is arranged in view of the material of the polymer dispersed liquid crystal and the arrangement as stated above, the moisture intrusion can be efficiently suppressed.

Second Embodiment

Figure 9:
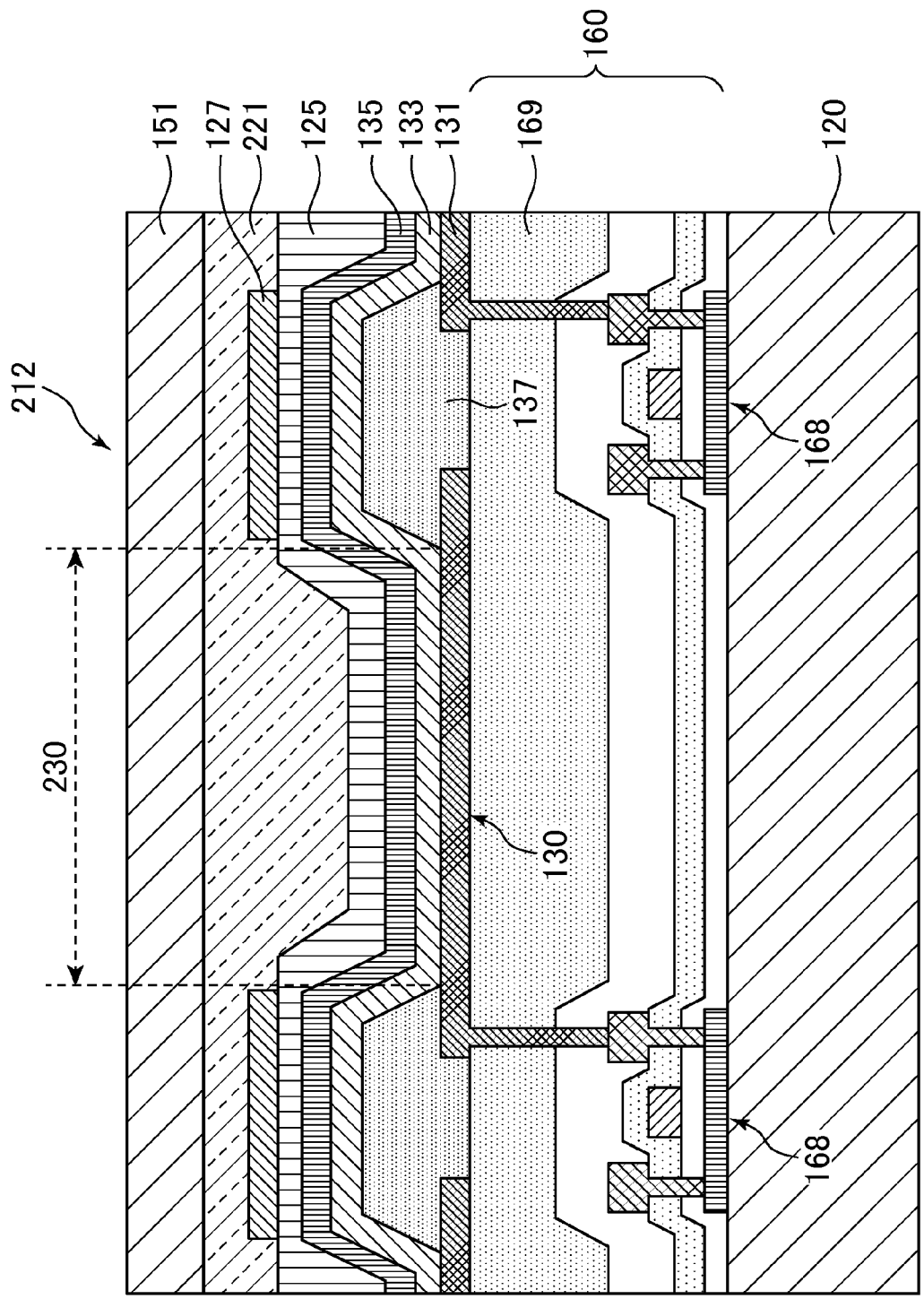
FIG. 9 is a view showing an example of a section of a sub-pixel of a second embodiment.

An organic EL display device as a light-emitting element display device of a second embodiment will be described. An outer appearance structure of the organic EL display device of the second embodiment is the same as that of the organic EL display device of the first embodiment, and the description thereof is omitted. FIG. 9 is a view of the organic EL display device of the second embodiment and shows an example of a section of a sub-pixel 212 in the same visual field as FIG. 5. As shown in this drawing, a point different from FIG. 5 of the first embodiment is that the electrode layer 152 is not provided, and an electrode layer 127 formed to overlap a pixel separation film 137 in plan view is provided on a sealing film 125. However, similarly to the first embodiment, the electrode layer 127 cooperates with an upper electrode 135 and can form an electric field to a polymer dispersed liquid crystal layer 221.

Figure 10:
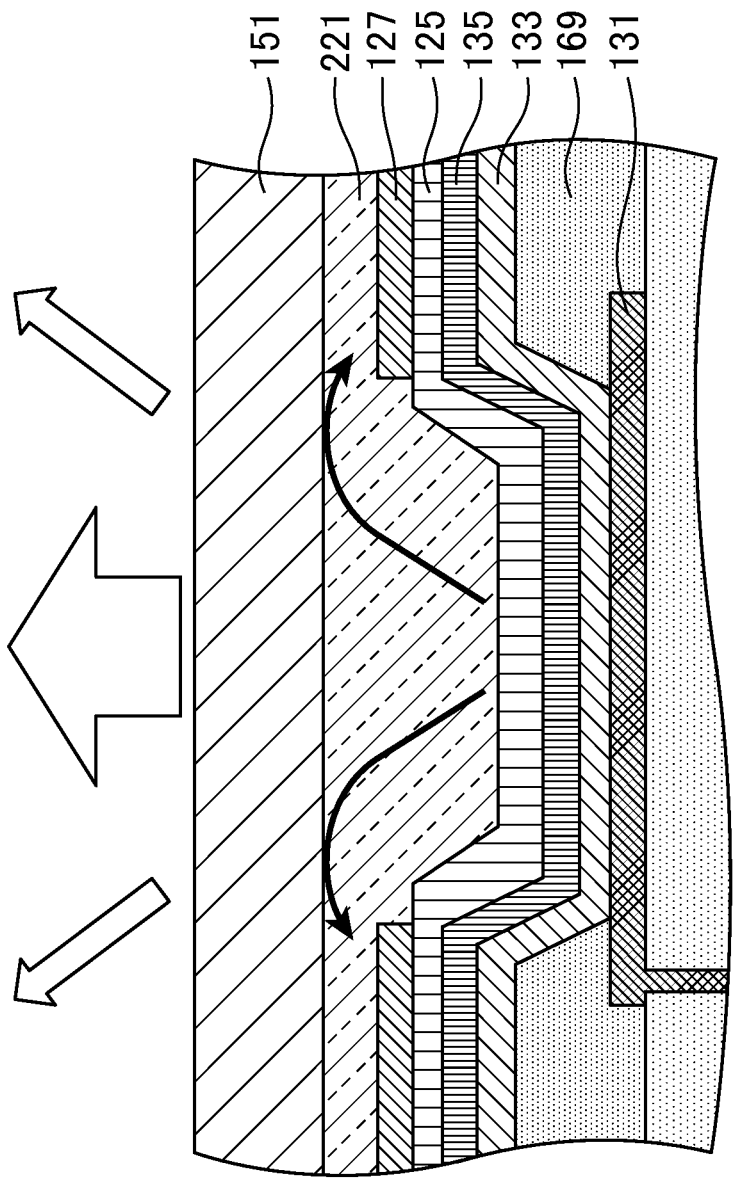
FIG. 10 is a view for explaining a case where a potential different from that of an upper electrode is applied to an electrode layer in the structure of FIG. 9.

When the same potential as that of the upper electrode 135 is applied to the electrode layer 127, the same state as FIG. 6 of the first embodiment occurs, and the scattering state occurs. Accordingly, in this case, light emitted from a light-emitting layer is scattered, and the light is emitted not only in a front direction but also in an oblique direction. As a result, image display with a wide viewing angle can be performed. FIG. 10 is a view showing a case where a potential different from that of the upper electrode 135 is applied to the electrode layer 127. In this case, an electric field is formed between the upper electrode 135 and the electrode layer 127, the electric field is formed in the polymer dispersed liquid crystal layer 221, and the transmission state occurs. Here, as indicated by arrows of the drawing, the electric field is formed similarly to the so-called IPS (In Plane Switching) type liquid crystal display device, and is a lateral electric field different from FIG. 7. Thus, the front brightness becomes higher than that in the scattering state. Especially, when the micro-cavity effect is used, the front brightness becomes further high. However, the front brightness is not given priority as compared with the case of FIG. 7, and a wide viewing angle is obtained similarly to the IPS type liquid crystal display device.

Figure 11:
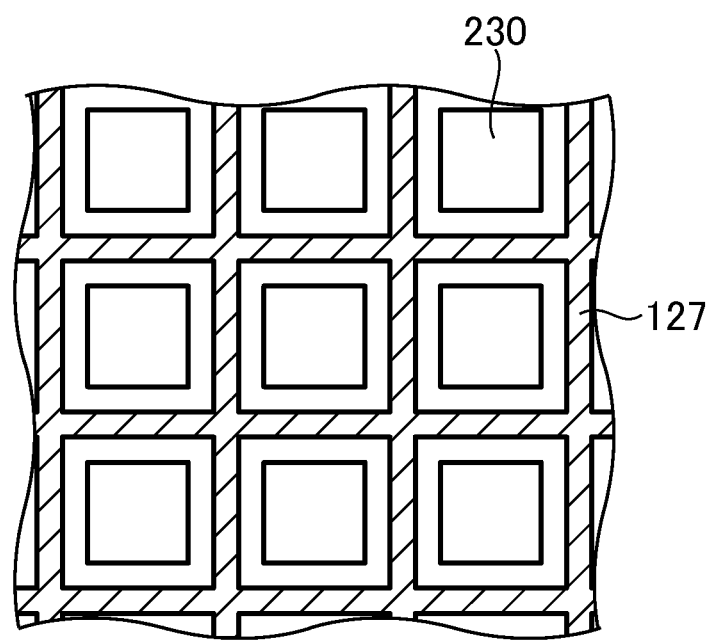
FIG. 11 is a view showing a state of arrangement of the electrode layer.

FIG. 11 is a plan view showing an example of arrangement of the electrode layer 127. As described above, since the electrode layer 127 is formed above the pixel separation film 137 around a light-emitting area 230, the electrode layer 127 is formed in a mesh shape (or lattice shape), and covers a display area 205.

Figure 12:
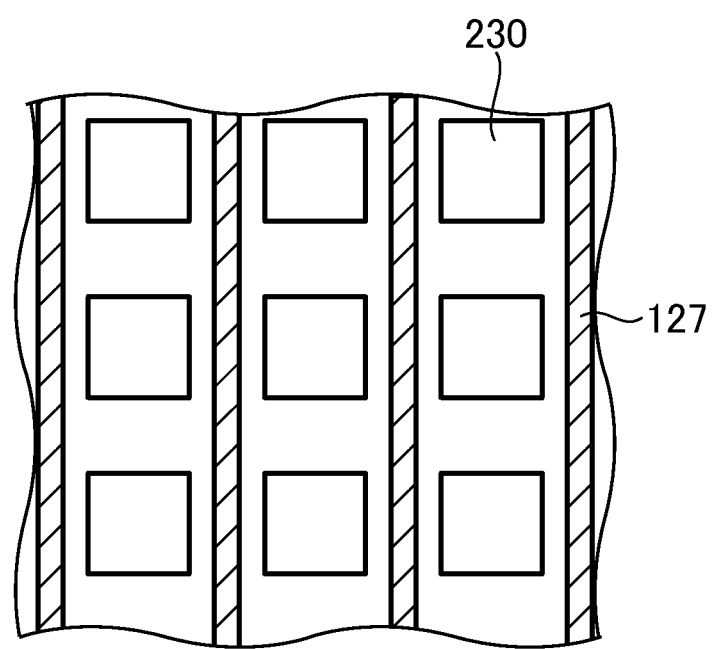
FIG. 12 is a plan view showing an example in which arrangement of the electrode layer is different.

FIG. 12 is a plan view showing an example in which the arrangement of the electrode layer 127 is different. As shown in this drawing, the electrode layer 127 includes electrode films extending in a strip shape and includes plural electrodes electrically independent of each other. Also in the case of the arrangement as stated above, the electric field can be formed in the polymer dispersed liquid crystal layer 221. Further, as compared with the case of FIG. 11, since the manufacturing process is simplified, the yield is improved. Besides, since a different potential can be applied to a part, only the part can be brought into the scattering state, and the other can be brought into the transmission state.

Figure 13:
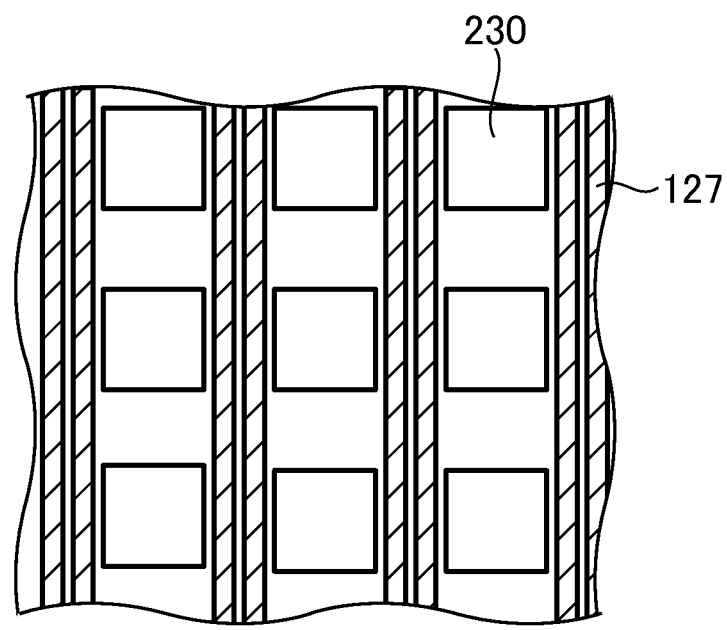
FIG. 13 is a plan view showing an example in which arrangement of the electrode layer is different.

FIG. 13 is a view showing an example in which the arrangement of the electrode layer 127 is different. As shown in this drawing, the electrode layer 127 includes two strip-shaped electrode films extending between adjacent light-emitting regions 230, that is, between lines extending in one direction of the adjacent pixels. When the arrangement is made in this way, the transmission state and the scattering state can be controlled for each of the lines of the sub-pixels 212. Incidentally, although the two electrode films are shown in FIG. 13, three or more electrode films may be provided.

A sealing film covering the display area 205 may be further provided on the electrode layer 127. Similarly to the first embodiment, the potential control part 184 can control the potential to the electrode layer 127 by a manual instruction or based on the output of the illuminance sensor 183. Besides, the potential control may be performed in multi-stage or continuously, and the same effect as that of the first embodiment can be obtained.

Besides, the polymer dispersed liquid crystal of the respective embodiments is brought into the transmission state when the electric field is generated, and the scattering state when the electric field is not generated. However, according to the use environment or design condition, a reverse type polymer dispersed liquid crystal may be adopted in which the scattering state occurs when the electric field is generated, and the transmission state occurs when the electric field is not generated.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A light-emitting element display device, comprising:
   a substrate including a display area having a plurality of pixels arranged in matrix form;
   a lower electrode provided in each of the plurality of pixels on the substrate and made of a conductor;
   an organic layer provided on the lower electrode and including a light-emitting layer;
   an upper electrode provided on the organic layer and made of a conductor;
   a polymer dispersed liquid crystal layer disposed at an opposite side to a substrate side of the upper electrode and covering the display area; and
   an electrode layer provided at the opposite side to the substrate side of the upper electrode and made of a conductor, in which
   the electrode layer is disposed to extend over the plurality of pixels.

2. The light-emitting element display device according to claim 1, wherein the electrode layer is a solid electrode covering all the display area.

3. The light-emitting element display device according to claim 1, wherein the electrode layer has a mesh shape or a strip shape and covers the display area.

4. The light-emitting element display device according to claim 1, wherein the polymer dispersed liquid crystal layer is provided between the electrode layer and the upper electrode.

5. The light-emitting element display device according to claim 4, further comprising an upper electrode sealing film covering the display area between the upper electrode and the polymer dispersed liquid crystal layer.

6. The light-emitting element display device according to claim 4, further comprising a polymer dispersed liquid crystal layer sealing film provided between the polymer dispersed liquid crystal layer and the electrode layer and covering the display area.

7. The light-emitting element display device according to claim 4, further comprising an electrode layer sealing film provided on the electrode layer and covering the display area.

8. The light-emitting element display device according to claim 1, wherein the organic layer has a micro-cavity structure in which light is resonated and enhanced.

9. The light-emitting element display device according to claim 1, further comprising:
- an external light sensor to measure a peripheral brightness; and
- a potential control part to control a potential of the electrode layer based on an output of the external light sensor.

10. A light-emitting element display device, comprising:
- a substrate including a display area having a plurality of pixels arranged in matrix form;
- a lower electrode provided in each of the plurality of pixels on the substrate and made of a conductor;
- a pixel separation film covering an end part of the lower electrode and defining a light-emitting area;
- an organic layer provided on the lower electrode and including a light-emitting layer;
- an upper electrode provided on the organic layer and made of a conductor;
- a sealing film provided on the upper electrode and covering the display area;
- an electrode layer provided on the sealing film in an area overlapping the pixel separation film in plan view and made of a conductor; and
- a polymer dispersed liquid crystal layer provided on the sealing film and the electrode layer and covering the display area.

11. The light-emitting element display device according to claim 10, wherein the electrode layer includes a plurality of electrodes electrically independent of each other in the display area.

12. The light-emitting element display device according to claim 11, wherein the plurality of electrodes extend in a strip shape in one direction in the display area.

13. The light-emitting element display device according to claim 12, wherein the plurality of electrodes extending in the strip shape are provided between lines of the adjacent pixels extending in the one direction.

14. The light-emitting element display device according to claim 10, wherein the electrode layer arranged on the display area is integrally provided and has a same potential.

15. The light-emitting element display device according to claim 10, wherein the organic layer has a micro-cavity structure in which light is resonated and enhanced.

16. The light-emitting element display device according to claim 10, further comprising:
- an external light sensor to measure a peripheral brightness; and
- a potential control part to control a potential of the electrode layer based on an output of the external light sensor.

* * * * *